(12) United States Patent
Yoon

(10) Patent No.: US 7,327,079 B2
(45) Date of Patent: Feb. 5, 2008

(54) ORGANIC ELECTROLUMINESCENT DEVICE

(75) Inventor: Myung Hee Yoon, Busan (KR)

(73) Assignee: LG Electronics Inc., Seoul (KR)

( * ) Notice: Subject to any disclaimer, the term of this patent is extended or adjusted under 35 U.S.C. 154(b) by 127 days.

(21) Appl. No.: 11/217,333

(22) Filed: Sep. 2, 2005

(65) Prior Publication Data

US 2006/0049748 A1   Mar. 9, 2006

(30) Foreign Application Priority Data

Sep. 8, 2004   (KR) ..................... 10-2004-0071663
Sep. 8, 2004   (KR) ..................... 10-2004-0071664

(51) Int. Cl.
*H01J 63/04* (2006.01)
(52) U.S. Cl. ...................... 313/504; 313/292
(58) Field of Classification Search ................. None
See application file for complete search history.

(56) References Cited

U.S. PATENT DOCUMENTS

| | | | |
|---|---|---|---|
| 5,773,931 A * | 6/1998 | Shi et al. ................... 313/509 |
| 6,114,715 A | 9/2000 | Hamada |
| 6,351,066 B1 | 2/2002 | Gyoutoku et al. |
| 7,012,367 B2 | 3/2006 | Seki |
| 2002/0008467 A1* | 1/2002 | Nagayama et al. ......... 313/506 |
| 2003/0230972 A1* | 12/2003 | Cok ............................ 313/504 |
| 2004/0063041 A1 | 4/2004 | Lu |
| 2005/0142977 A1 | 6/2005 | Park |
| 2006/0038947 A1* | 2/2006 | Rho et al. .................... 349/122 |
| 2006/0290271 A1* | 12/2006 | Cok ............................ 313/504 |
| 2007/0001602 A1* | 1/2007 | Miyake et al. .............. 313/582 |

FOREIGN PATENT DOCUMENTS

| | | |
|---|---|---|
| EP | 0 996 314 A1 | 4/2000 |
| EP | 1 372 200 A2 | 12/2003 |
| KR | 1999-0057105 B1 | 7/1999 |
| KR | 2003-0051326 A | 6/2003 |

* cited by examiner

*Primary Examiner*—Karabi Guharay
*Assistant Examiner*—Britt Hanley
(74) *Attorney, Agent, or Firm*—Birch, Stewart, Kolasch & Birch, LLP

(57) ABSTRACT

The present invention is characterized in having the structure which can reduce reflection ratio of exterior light when the device is not operating, that is, when light is not emitted from the device. To this end, the structural elements formed on the non-emitting areas are formed with dark color black matrix material. To have the structure, the present organic electroluminescent device comprises indium-tin-oxide (ITO) layers formed on a glass substrate; insulating layers formed on non-emitting area of the ITO layers, each insulating layer being formed with dark colored material; a plurality of walls formed on the insulating layers; and organic electroluminescence layers and metal layers formed sequentially on the entire structure including the walls, the organic electroluminescence layers and metal layers being separated from adjacent organic electroluminescence layers and metal layers by the walls. Each insulating layer is consisted of a black matrix film formed on the ITO layer and an insulating film formed on the black matrix film in the shape of wrapping the black matrix material layer. On the contrary, each insulating layer formed below the wall is consisted of an insulating layer formed on the ITO layer and a black matrix film formed on the insulating film. Also, in the present organic electroluminescent device, the walls can be formed with back matrix material.

3 Claims, 2 Drawing Sheets

FIG. 1 [Related Art]
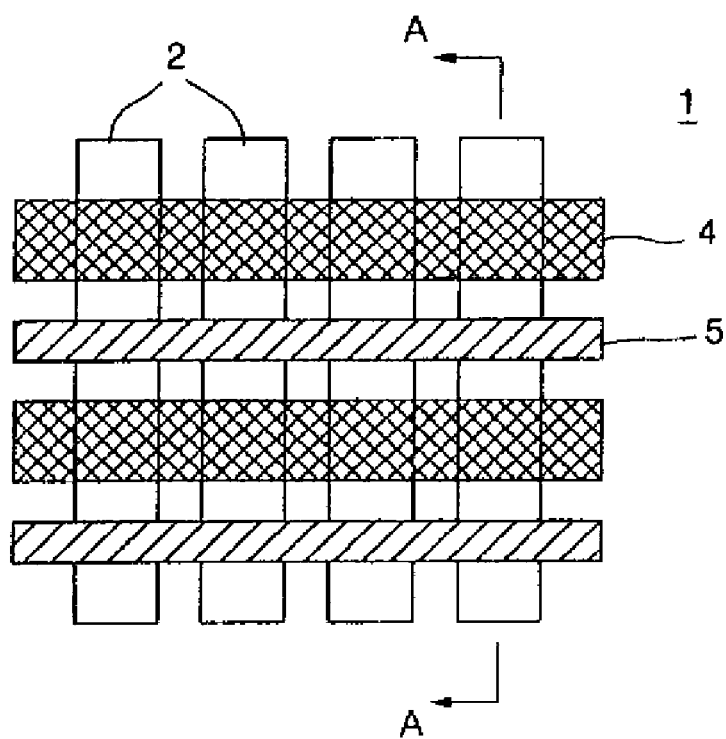
FIG. 2 [Related Art]
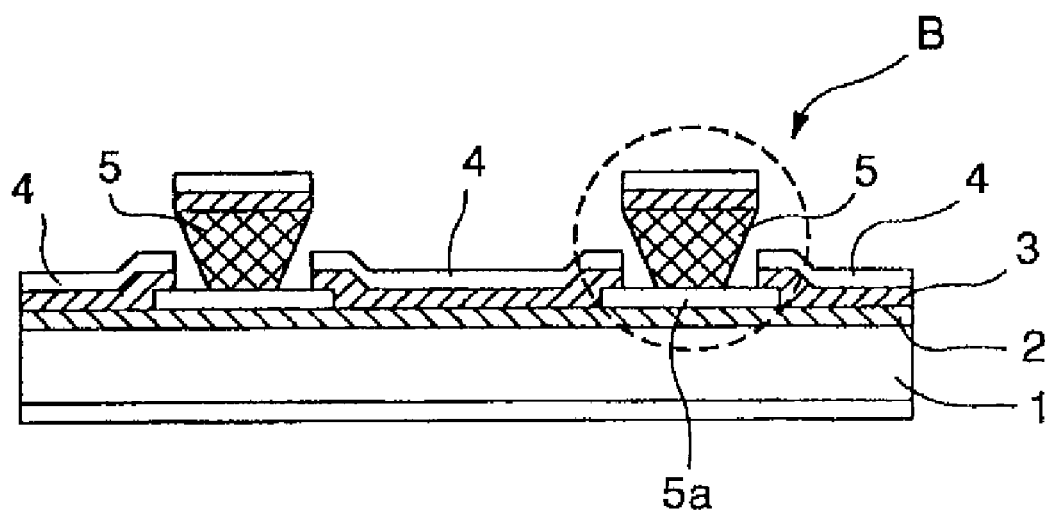

ORGANIC ELECTROLUMINESCENT DEVICE

BACKGROUND OF THE INVENTION

1. Field of the Invention

The present invention relates to an organic electroluminescent device, and particularly, to an organic electroluminescent device which can enhance its contrast by forming the structural element formed on non-emitting area with dark colored black matrix material.

2. Description of the Prior Art

Organic electroluminescence is the phenomenon that excitons are formed in an (low molecular or high molecular) organic material thin film by re-combining holes injected through an anode with electrons injected through a cathode, and light of specific wavelength is generated by energy from thus formed excitons.

FIG. 1 is a plane view of an organic electroluminescent device, and FIG. 2 is a sectional view taken along the line A-A in FIG. 1. These figures schematically illustrate the basic structure of organic electroluminescent device using the above phenomenon.

The basic structure of organic electroluminescent device includes a glass substrate 1, indium-tin-oxide layers 2 (hereinafter, referred as "ITO layer") formed on the glass substrate 1 and acting as anode electrodes, organic electroluminescence layers 3 formed with organic material, and metal layers 4 acting as cathode electrodes.

The organic electroluminescent device having the above structure is produced through the following processes.

First, the ITO layer is formed on the glass substrate 1 through the vacuum deposition method, and the ITO layer is patterned by the photolithography method to form the ITO electrodes (layers) 2. Then, insulating layers 5a are formed on certain areas of the ITO layers 2, and walls 5 are formed on the insulating layers 2.

Then, the organic electroluminescence layer 3, and the metal layer 4 are formed on the entire structure including the walls 5 in order. Here, the ITO layers 2 disposed on the transparent substrate 1 act as the anode electrodes, and the metal layers 4 act as the cathode electrodes.

As shown in FIG. 1 and FIG. 2, each wall 5 is formed to divide the organic electroluminescence layers 3 and the metal layers 4 into a number of sections. That is, each wall 5 is formed on a space between adjacent two metal layers 4 to separate the metal layers 4, and each wall is separated from the ITO layer 2 through the insulating layer 5a.

Although the methods for improving contrast of the organic electroluminescent device having the general structure as described above have been discussed and developed, technical development for improving the contrast has been restricted due to the device's structure and the used material's characteristic.

SUMMARY OF THE INVENTION

An object of the present invention is to provide an organic electroluminescent device which can enhance its contrast without modifying its structure.

To improve the overall contrast of the device, the present invention adopts the structure which can reduce the reflection ratio of exterior light when the device is not operating, that is, when the device does not emit light.

For this end, in the present invention, the structural elements formed on non-emitting areas of the device are formed with dark colored black matrix material which has low optical reflectivity, and so brightness of the device (that is, reflection ratio of exterior light) could be remarkably reduced when the device is not operating, without affecting the emitting function in the emitting area.

To achieve the above object and function, the organic electroluminescent device according to the present invention comprises indium-tin-oxide (ITO) layers formed on a glass substrate; insulating layers consisted of dark colored material, formed on non-emitting area of the ITO layers; a plurality of walls formed on the insulating layers; and organic electroluminescence layers and metal layers, divided by walls and formed sequentially on the entire structure including the walls.

In the organic electroluminescent device according to the present invention, each of the insulating layers formed below the walls is consisted of a black matrix film formed on the ITO layer, and an insulating film in the shape of wrapping the black matrix material layer. Or, on the contrary, each of the insulating layers is consisted of an insulating film formed on the ITO layer and a black matrix film formed on the insulating film.

The organic electroluminescent device according to the present invention having another structure comprises; indium-tin-oxide (ITO) layers formed on a glass substrate; a plurality of walls made of dark colored black matrix material, formed on non-emitting areas of the ITO layers; and organic electroluminescence layers and metal layers divided by walls, formed sequentially on the entire structure including the walls.

The black matrix material used in the present invention can be a mixture of black material and at least any one of insulating material, organic material, and non-organic material, or a mixture of insulating material (photoresist), and R (red), G (green), and B (blue) dyes

BRIEF DESCRIPTION OF THE DRAWINGS

The present invention will be more clearly understood from the detailed description in conjunction with the following drawings.

FIG. 1 is a plane view showing schematically the basic structure of organic electroluminescent device;

FIG. 2 is a sectional view taken along the line A-A in FIG. 1;

DETAILED DESCRIPTION OF THE INVENTION

Hereinafter, the embodiments of the present invention will be described in detail with reference to those accompanying drawings.

Figure 3:
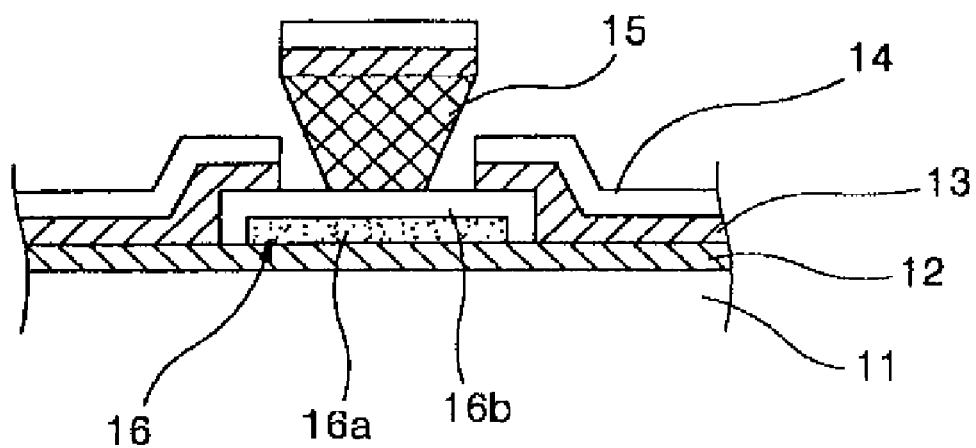
FIG. 3 is a partial sectional view of the organic electroluminescent device according to the first embodiment of the present invention and corresponds to "B" portion of FIG. 2.

FIG. 3 is a partial sectional view of the organic electroluminescent device according to the first embodiment of the present invention and corresponds to "B" portion of FIG. 2.

The entire structure of the organic electroluminescent device according to this embodiment is the same as that shown in FIG. 1 and FIG. 2. Accordingly, only characteristic section of the organic electroluminescent device according to this embodiment is enlarged and shown in FIG. 3.

A process for producing the organic electroluminescent device and a structure thereof are described with reference to FIG. 3 below.

First, an ITO layer 12 is formed on a glass substrate 11 through the vacuum deposition method, and the ITO layer 12 is patterned by the photolithography method to form the ITO electrode. Then, an insulating layer 16 is formed on a certain area of the ITO layer 12, and a wall 15 is formed on the insulating layer 16.

In the organic electroluminescent device according to this embodiment, the insulating layer 16 is consisted of a black matrix film 16a formed on the ITO layer 12 and an insulating film 16b formed on the black matrix film. The black matrix film 16a is consisted of a mixture of a black material (i.e. black carbon) and at least any one of insulating material, organic material, and non-organic material so that the black matrix film has dark color with weak brightness.

Also, the black matrix film 16a can be formed with a mixture of the photoresist which is the conventional insulating material, and R (red), G (green), and B (blue) dyes.

The insulating film 16b made with the conventional insulating material (e. g. photoresist) is formed on the black matrix film 16a made with the material mentioned above.

After the insulating layer 16 consisted of the dark colored black matrix film 16a and the insulating film 16b having excellent insulating property is formed on a selected area of the ITO layer 12, the wall 15 is formed on the insulating layer 16. Thereinafter, the organic electroluminescence layers 13 made from organic material, and metal layer 14 are formed sequentially on the entire structure including the wall 15.

The functional characteristic of the organic electroluminescent device according to the first embodiment of the present invention constituted as above is as follows.

The contrast of the device can be expressed in the following equation;

$$\text{Contrast} = \frac{B_{on}}{B_{off}}$$

[wherein $B_{on}$ indicates brightness of the device when the power is supplied (that is, the device is operating), and $B_{off}$ indicates reflection ratio (brightness) of exterior light when the power is not supplied (that is, the device is not operating)].

As shown from the above equation, the contrast of the device depends on brightness of the device when it is operating and reflection ratio of exterior light when the device is not operating. Accordingly, the device's contrast can be adjusted by adjusting brightness of the device when it is operating and reflection ratio of exterior light when the device is not operating.

Comparing the device's contrast between a case of increasing brightness of the device at the time of operation and a case of decreasing reflection degree of exterior light at the time of non-operation, by the same amount, it is known that the brightness of the device can be more enhanced by decreasing the reflection ratio of exterior light at the time of non-operation.

Accordingly, in the first embodiment of the present invention, a part of the insulating layer 16 formed below the wall 15 which is a typical non-emitting area of the device is made with dark colored black matrix film 16a having lower reflection ratio of exterior light, and so the brightness (reflection ratio of exterior light) of the device is remarkably reduced at the time of non-operation without affecting the emitting function in the emitting area. Consequently, the contrast of the device can be significantly enhanced.

On the other hand, making the entire insulating layer 16 formed below the wall 15 with black matrix layer can help to enhance the contrast of the device. However, due to lower insulating property of black matrix material, it is desirable that the insulating layer 16 has a stack structure consisted of the black matrix film 16a and the insulating film 16b made with conventional insulating material.

In particular, since the material forming the black matrix film 16a has lower insulating property, it is desirable that the upper insulating film 16b is formed in the shape of completely wrapping the insulating film 16b with black matrix film 16a for more complete insulation.

Figure 4:
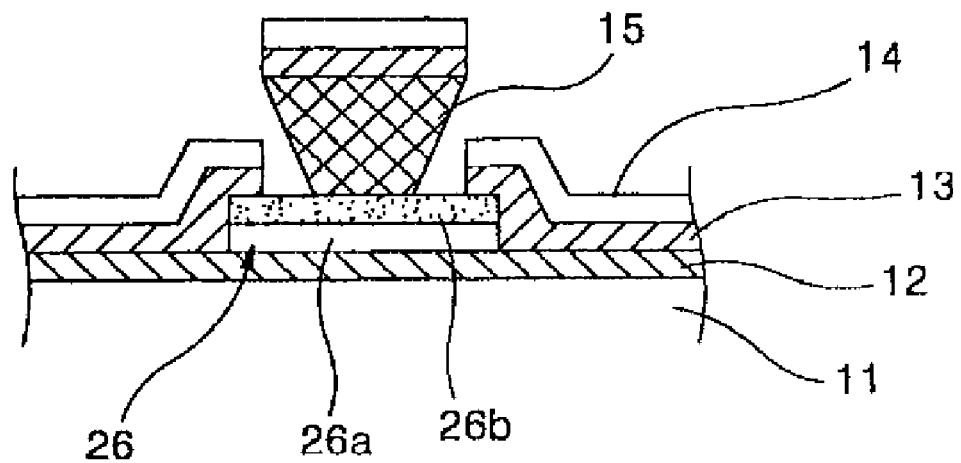
FIG. 4 is a partial sectional view of the organic electroluminescent device according to the second embodiment of the present invention and corresponds to "B" portion of FIG. 2.

FIG. 4 is a partial sectional view of the organic electroluminescent device according to the second embodiment of the present invention and corresponds to "B" portion of FIG. 2. The entire structure of the organic electroluminescent device shown in FIG. 4 is the same as that of the device shown in FIG. 3. Accordingly, the elements that are similar in the first and second embodiments are represented by the same reference numerals.

The entire structure of the organic electroluminescent device according to this embodiment and the method for manufacturing the same are the same as those of the device shown in FIG. 3.

That is, an ITO layer 12 is formed on a glass substrate 11 through the vacuum deposition method, and the ITO layer 12 is patterned by the photolithography method to form the ITO electrodes (layers). Then, an insulating layer 26 is formed on a certain area of the ITO layer 12, and a wall 15 is formed on the insulating layer 26.

In the organic electroluminescent device as shown in FIG. 4, the insulating layer 26 is consisted of a lower insulating film 26a formed on the ITO layer and a black matrix film 26b formed on the insulating film. As described above, the black matrix film 26b is made from a mixture of a black material (i.e. black carbon) and at least any one of insulating material, organic material, and non-organic material so that the black matrix film has dark color with weak brightness.

After the insulating layer 26 constituted as described above is formed on a selected area of the ITO layer 12, the wall 15 is formed on the insulating layer 26. Thereinafter, an organic electroluminescence layer 13 made from organic material, and a metal layer 14 are formed sequentially on the entire structure including the wall 15.

In the organic electroluminescent device constituted as described above, a part of the insulating layer formed below the wall, which is a typical non-emitting area of the device, is made with dark colored black matrix film having lower reflection ratio of exterior light, like the device described in FIG. 3. By this structure, the reflection ratio of exterior light is remarkably reduced at the time of non-operation without affecting the emitting function in the emitting area. Consequently, the contrast of the device can be significantly enhanced.

The most important feature of the organic electroluminescent device according to the third embodiment of the present invention is to form the walls which are typical non-emitting areas of the device with black matrix material. Hereinafter, the third embodiment of the present invention will be described in detail with reference to FIG. 2.

In this embodiment, black matrix material used for forming the walls 5 is a mixture of at least one of insulating material, organic material, non-organic material, and high molecular material, and black matrix material (for example, black carbon and the like).

Also, the black matrix material can be a mixture of photoresist which is conventional insulating material, and R (red), G (green), and B (blue) dyes. By using these materials, the walls 5 are formed on a selected area of the ITO layer 2.

After the walls 5 are formed on the selected area of the ITO layer 2 as described above, the organic electroluminescence layer 3 made with organic material, and the metal layer 4 are formed sequentially on the entire structure including the walls 5.

Like the first and second embodiments, in the organic electroluminescent device according to this embodiment, the walls which are typical non-emitting areas of the device are formed with dark colored black matrix film having lower reflection ratio of exterior light, and so the brightness (that is, reflection ratio of exterior light) of the device could be remarkably reduced at the time of non-operation without affecting the emitting function in the emitting area. Consequently, the contrast of the device can be significantly enhanced.

In sum, the present invention forms dark colored black matrix films on non-emitting areas of the device, and can remarkably reduce the reflection ratio of exterior light at the time of non-operation without affecting the emitting function in the emitting area. Consequently, the contrast of the device could be significantly enhanced.

The preferred embodiments of the present invention have been described for illustrative purposes, and those skilled in the art will appreciate that various modifications, additions, and substitutions are possible, without departing from the scope and spirit of the present invention as disclosed in the accompanying claims.

What is claimed is:

1. An organic electroluminescent device comprising;
    indium-tin-oxide (ITO) layers formed on a glass substrate;
    insulating layers formed on non-emitting area of the ITO layers;
    walls formed on the insulating layers; and
    organic electroluminescence layers and metal layers formed sequentially on the entire structure including the walls, the organic electroluminescence layers and metal layers being separated from adjacent organic electroluminescence layer and metal layer by the walls,
    wherein each of the insulating layers is consisted of a black matrix film formed on the ITO layer, and an insulating film formed on the black matrix film in a shape of wrapping the black matrix film on at least three sides thereof.

2. The organic electroluminescent device according to claim 1, wherein the black matrix film is formed from a mixture of a black material and an insulating material.

3. The organic electroluminescent device according to claim 1, wherein the black matrix film is formed with a mixture of an insulating material, and R (red), G (green), and B (blue) dyes.

* * * * *